United States Patent
Yu

(10) Patent No.: US 6,605,493 B1
(45) Date of Patent: Aug. 12, 2003

(54) SILICON CONTROLLED RECTIFIER ESD STRUCTURES WITH TRENCH ISOLATION

(75) Inventor: Ta-Lee Yu, Hsin-chu Chien (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/941,278

(22) Filed: Aug. 29, 2001

(51) Int. Cl.$^7$ .............................................. H01L 21/332
(52) U.S. Cl. ........................ 438/135; 257/355; 257/133; 257/173
(58) Field of Search ................................. 438/231, 232, 438/296, 286, 294, 295, 299, 133, 135, 142, 197, 234, 236, 238, 279, 284; 257/133, 330, 360, 356

(56) References Cited

U.S. PATENT DOCUMENTS

| | | | |
|---|---|---|---|
| 4,939,616 A | 7/1990 | Rountree | 361/56 |
| 5,012,317 A | 4/1991 | Rountre | 357/38 |
| 5,225,702 A * | 7/1993 | Chatterjee | 257/360 |
| 5,465,189 A | 11/1995 | Polgreen et al. | 361/58 |
| 5,629,544 A | 5/1997 | Voldman et al. | 257/355 |
| 5,898,193 A * | 4/1999 | Ham | 257/173 |
| 5,923,067 A | 7/1999 | Voldman | 257/349 |
| 5,945,713 A | 8/1999 | Voldman | 257/355 |
| 6,074,899 A | 6/2000 | Voldman | 438/155 |
| 6,081,002 A | 6/2000 | Amerasekera et al. | 257/173 |
| 6,323,523 B1 * | 11/2001 | Lee et al. | 257/355 |
| 6,365,468 B1 * | 4/2002 | Yeh et al. | 438/295 |
| 6,368,931 B1 * | 4/2002 | Kuhn et al. | 438/359 |

FOREIGN PATENT DOCUMENTS

JP        405121670 A  *  5/1993

OTHER PUBLICATIONS

S. Voldman et al., "Semiconductor Process and Structural Optimization of Shallow Trench Isolation–Defined and Polysilicon–Bound Source/Drain Diodes for ESD Networks," EOS/ESD Symposium 98–151, pp. 151–160.

* cited by examiner

Primary Examiner—Wael Fahmy
Assistant Examiner—Dana Farahani
(74) Attorney, Agent, or Firm—George O. Saile; Stephen B. Ackerman

(57) ABSTRACT

A novel device structure and process are described for an SCR ESD protection device used with shallow trench isolation structures. The invention incorporates polysilicon gates bridging SCR diode junction elements and also bridging between SCR elements and neighboring STI structures. The presence of the strategically located polysilicon gates effectively counters the detrimental effects of non-planar STI "pull down" regions as well as compensating for the interaction of silicide structures and the effective junction depth of diode elements bounded by STI elements. Connecting the gates to appropriate voltage sources such as the SCR anode input voltage and the SCR cathode voltage, typically ground, reduces normal operation leakage of the ESD protection device.

11 Claims, 7 Drawing Sheets

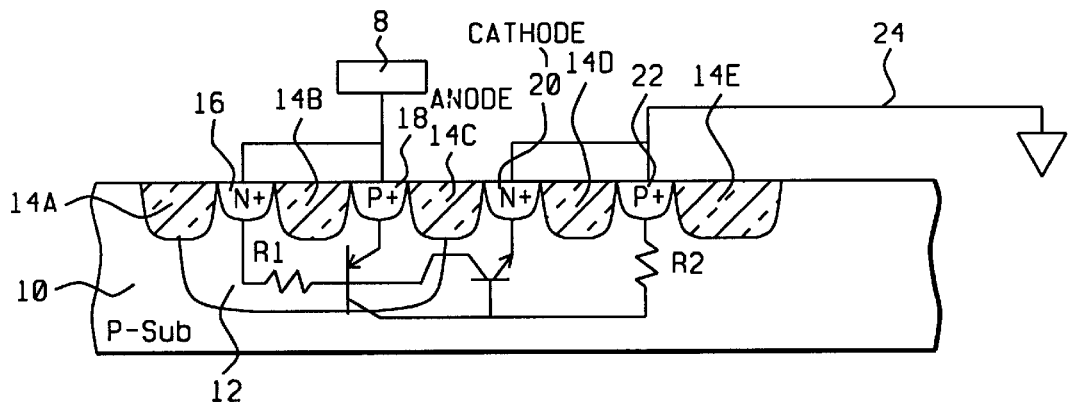
FIG. 1A – Prior Art
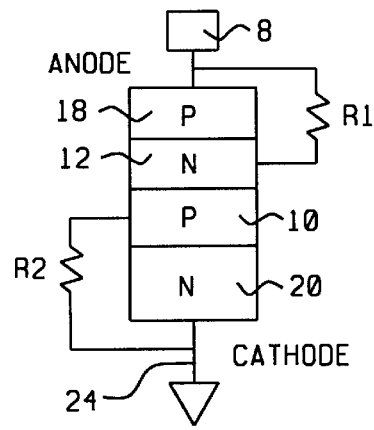
FIG. 1B – Prior Art
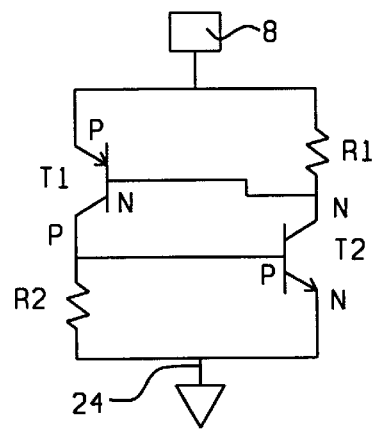
FIG. 1C – Prior Art

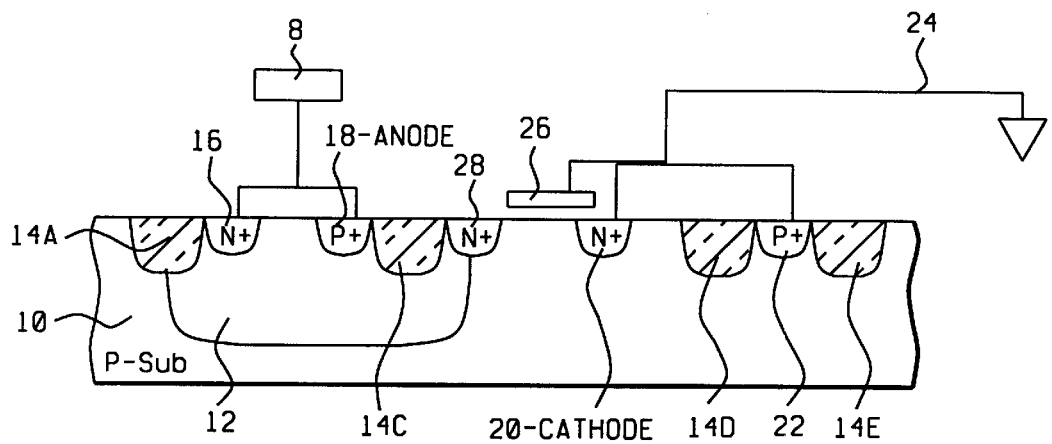
FIG. 2A – Prior Art
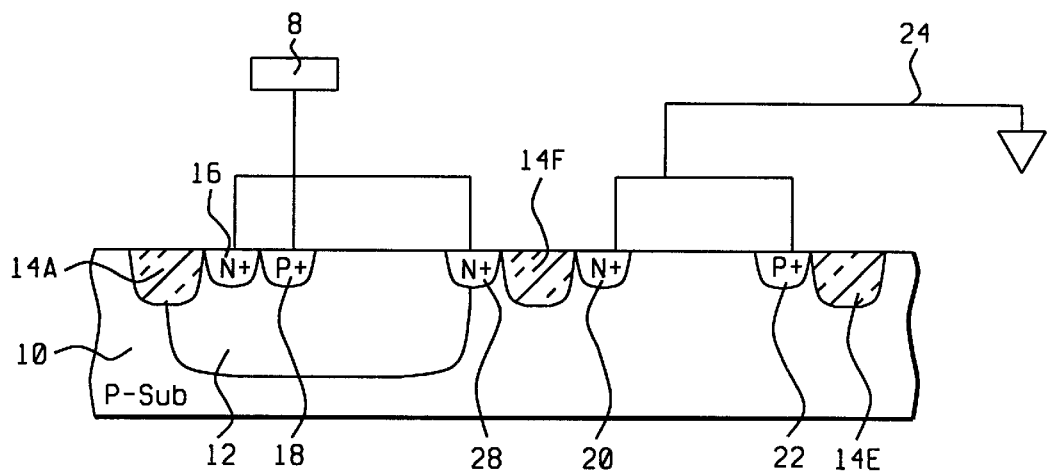
FIG. 2B – Prior Art

SILICON CONTROLLED RECTIFIER ESD STRUCTURES WITH TRENCH ISOLATION

BACKGROUND OF THE INVENTION (1) Field of the Invention

The present invention relates generally to a structure and manufacturing process of a semiconductor device which provides improved ESD protection for internal active semiconductor devices and more particularly to a semiconductor SCR like device which when used with shallow trench isolation, provides improved parasitic bipolar characteristics resulting in improved ESD protection performance.

(2) Description of Prior Art

The discharge of electrostatic energy from the human body or other sources known as Electrostatic discharge (ESD) into the input or output pads of integrated circuit semiconductor devices has shown to cause catastrophic failures in these same circuits. This is becoming more important as modem metal oxide semiconductor circuit technology (MOS) is scaled down in size and increased in device and circuit density. Prevention of damage from ESD events is provided by protection devices or circuits on the input or output pads of the active logic circuits which shunt the ESD energy to a second voltage source, typically ground, thereby bypassing the active circuits protecting them from damage. Various devices such as silicon controlled rectifiers (S(CR) have been utilized to essentially shunt the high ESD energy and therefore the ESD stress away from the active circuits.

Isolation is required between these ESD protection devices and the active circuit devices, as well as between the active devices themselves. Originally areas of local thick oxide, often called LOCOS or field oxide, have been used to provide this isolation. While having good isolation properties, this isolation method uses more surface area, or "real estate", than an alternative isolation method using shallow, relatively narrow trenches filled with a dielectric, typically silicon oxide ($SiO_2$), called shallow trench isolation (STI).

While providing good isolation properties, the STI structure has limiting effects on the current triggering and capacity of the SCR ESD protection devices. As discussed in the paper "Semiconductor Process and Structural Optimization of Shallow Trench Isolation-Defined and Polysilicon-Bound Source/Drain Diodes for ESD Networks" by Voldman et al., EOS/ESD Symposium 98–151, pages 151 to 160, during STI formation, the STI region is exposed to the etching process, leading to non-planer STI edges where the silicon region extends above the isolation edge. The non-planer STI edge is called "STI pull-down". The impact of STI pull-down, and the interaction with the salicide process typically used in current contact technology, as well as junction depth reduction of the diode elements bounded by the STI devices, all degrade ESD protection capabilities by reducing the parasitic bipolar current gain, beta, ($\beta$). This increases the holding voltage and trigger current of the lateral SCR, reduces lateral heat transfer capability, and possibly limits the type of ESD networks implemented. Among other things, this can result in device failure before the SCR is fully on, or a high on-resistance for the SCR reducing the ESD failure threshold.

FIG. 1A is a simplified cross section of a typical prior art SCR ESD protection device. Shown is a P substrate 10, with an N-well 12 and which contains contact regions N+ 16 and P+ 18. The N-well 12 contact regions are isolated and bounded by the shallow trench isolation (STI) structures 14A, 14B and 14C. The N-well 12 is also bounded by STI elements 14A and 14C. The P substrate also contains N+ contact 20 bounded by STI elements 14C and 14D, and P+ contact 22 bounded by STI structures 14D and 14E. Also depicted in FIG. 1A are parasitic vertical PNP bipolar transistor T1 and lateral NPN bipolar transistor T2 with parasitic resistors R1 and R2. As is well recognized, an SCR device is essentially a P-N-P-N structure as depicted in FIG. 1B. The P+ contact 18 is the anode end of the device and is connected to the active circuit input or output pad 8 as well as to the N+ N-well contact 16. The junction between the P+ contact region 18 and the N-well 12 is the first junction of the SCR.

The N-well 12 and the P substrate 10 form the second junction. The third device junction is formed by the substrate 10 and substrate N+ contact 20, which also is the cathode terminal of the device. N+ contact 20 is connected to a second voltage source 24, typically ground, and also to substrate P+ contact 22. FIG. 1C represents the electrical schematic of the prior art device showing the parasitic vertical bipolar PNP transistor T1 and parasitic lateral NPN bipolar transistor T2 as well as the resistors R1 and R2. A positive ESD voltage event will cause the T1 base-collector junction to go into avalanche conduction, turning on T2 and providing the regenerative conduction action shunting the ESD current to the second voltage source, typically ground. A negative ESD voltage pulse will forward bias the base-collector junction of T1, again shunting the current to the second voltage source.

However, as indicated above, the STI isolation structures inhibit lateral current conduction near the surface, lower the parasitic bipolar semiconductor current gain, and can interfere with device thermal characteristics.

FIG. 2A represents another prior art protection device, a low voltage trigger SCR (LVTSCR). There is no STI between the N-well N+ contact 16 and SCR P+ anode 18. The STI structure has essentially been replaced by a N+ region 28 straddling the N-well to P substrate lateral boundary. A FET gate has been inserted between the N+ region 28 and the N+ region 20 which essentially become the drain and source of a NFET respectively. The NFET source region also functions as the SCR cathode. The prior art LVTSCR device operational trigger voltage is reduced by the NFET device breakdown voltage. The STI elements still reduce the desirable ESD protection characteristics as previously discussed.

FIG. 2B represents a prior art modified lateral SCR. This device does not have the NFET of the LVTSCR, but retains the N+ region 28 straddling the N-well 12 and the P substrate 10 lateral boundary and which provides an additional source of current for triggering the SCR thereby enabling a lower trigger voltage than a more conventional SCR.

The invention in various embodiments allows selective use of STI elements while improving ESD protection by the strategic use of polysilicon gates The following patents describe ESD protection devices.

U.S. Pat. No. 5,465,189 (Polgreen et al.) shows a SCR with isolation.

U.S. Pat. No. 5,012,317 (Rountree) shows a conventional SCR protection device.

U.S. Pat. No. 4,939,616 (Rountree) sows another SCR type device.

U.S. Pat. No. 6,081,002 (Arnerasekera et al.), U.S. Pat. No. 5,629,544 (Voldman et al.), U.S. Pat. No. 6, 074,899 (Voldman et al.), U.S. Pat. No. 5,945,713 (Voldman), and U.S. Pat. No. 5,923,067 (Voldman) show related SCR protection devices which use STI elements.

The following technical report discusses STI bound ESD protection networks

"Semiconductor Process and Structural Optimization of Shallow Trench Isolation-Defined and Polysilicon-Bound Source/Drain Diodes for ESD Networks" by Voldman et al., EOS/ESD Symposium 98–151, pages 151 to 160.

SUMMARY OF THE INVENTION

Accordingly, it is the primary objective of the invention to provide a novel, effective structure and manufacturable method for protecting integrated circuits., in particular field effect transistor devices, from damage caused by electrostatic discharge (ESD) events during normal operation.

It is a further objective of the invention to improve ESD protection involving SCR elements employing shallow trench isolation (STI).

In addition, it is an objective of this invention to minimize degradation in the SCR diode device characteristics such as diode leakage.

It is yet another object of the invention to provide a manufacturable method for forming the SCR ESD protection structure while maintaining the required operating characteristics of the devices being protected.

The above objectives are achieved in accordance with the embodiments of the invention that describes a novel structure and process for a SCR like ESD protection device. The device is situated on a semiconductor substrate, typically P dope, and containing a N-well with P+ and N+ contact regions. A STI structure defines one N-well-substrate lateral boundary as well as the N-well N+ contact lateral boundary near the substrate surface. A second STI structure defines the N-well to P substrate lateral boundary near the substrate surface on the N-well side opposite the N+ contact region. A third STI structure defines one lateral or horizontal boundary near the surface for the P+ substrate contact.

A N-well P+ contact and a N+ substrate contact are also defined. The N-well P+ region forms the anode of the SCR device, and is electrically connected to the N+ N-well contact and to the active logic device input or output pad. The substrate N+ element forms the SCR cathode and is electrically connected to the substrate P+ contact and to a second voltage source, typically ground. A feature of the invention uses gate elements, typically polysilicon with salicides, that overlay the surface regions between the N-well N+ and P+ contact regions and the N-well P+ contact region and adjacent STI. The N-well contacts and associated gate elements are electrically tied together and to the first voltage source, typically the active device input pad.

Similar gate elements overlay the surface regions between the substrate P+ and N+ contact regions and the substrate N+ and adjacent STI element. The substrate contacts and associated gate elements are electrically connected together and to the second voltage source, typically ground. The uniqueness of the invention structure is in the insertion of the gate elements and the elimination of the prior art STI structure between the anode N+-P+ contacts and the cathode N+ and P+ contacts.

In alternative invention embodiments, the gate structures are utilized in low voltage trigger SCR (LVTSCR) devices and also in the modified lateral SCR device.

BRIEF DESCRIPTION OF THE DRAWINGS

FIG. 1A is a cross sectional representation of a prior art SCR ESD protection device structure showing the isolation elements and parasitic bipolar elements.

FIG. 1B is a representation of the junction elements of the prior art SCR ESD protection device.

FIG. 1C represents the electrical schematic of the prior art SCR ESD protection device.

FIG. 2A represents a prior art low voltage trigger SCR (LVTSCR) protection device cross section.

FIG. 2B represents a prior art modified lateral SCR ESD protection device.

DESCRIPTION OF THE PREFERRED EMBODIMENTS

Figure 3A:
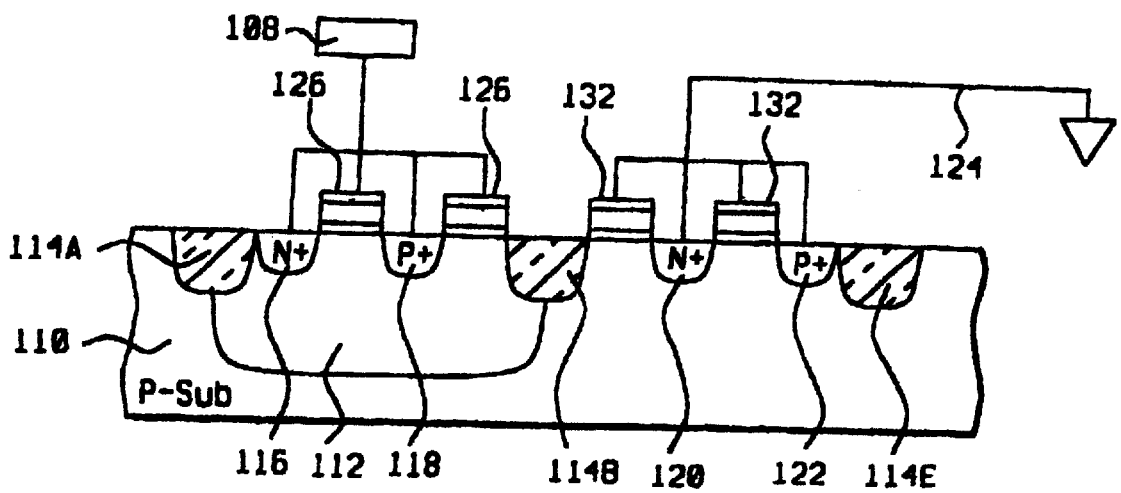
FIG. 3A is a representation of the cross section of one embodiment of the invention for a SCR ESD protection device.
Figure 3B:
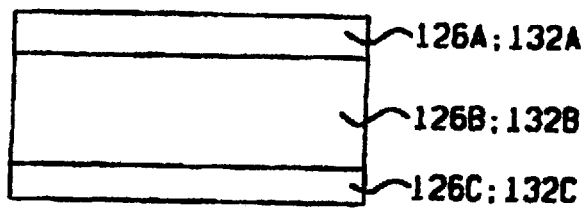
FIG. 3B is a representation of an FET gate detail.

FIG. 3A shows a simplified cross section of one embodiment of the invention. A P doped substrate 110 with typical doping concentration of between 1E14 and 1E16 atoms/cm$^3$ (a/cm$^3$) contains an N-well 112 with typical dopent concentration between 1E16 and 1E18 a/cm$^3$. The N-well 112 is bounded at and near the surface by shallow trench isolation (STI) elements 114A and 114B, typically between 0.2 to 1 um wide and 0.4 to 2.5 um deep. The STI elements are filled with a dielectric, typically silicon oxide (SiO$_2$). Within the N-well region 112 are a N+ 116 and P+ 118 contact regions, with typical dopent densities of between 1E19 and 1E21 a/cm$^3$. The N+ region is bounded on the side away from the P+ contact 18 by the STI 114A. Overlaying the surface between the N+ contact 116, P+ contact 118, and between P+ contact 118 and STI 114B, is gate element 126. As depicted in FIG. 3B, the gate element 126 is composed of gate oxide insulation 126C, typically SiO$_2$ with a thickness between 50 and 180 angstroms (Å), and a doped polysilicon conductor element 126B with a thickness between 1500 and 3000 Å and with a refractory metal 126A such as titanium (Ti) or cobalt (Co). The polysilicon (poly) is typically doped with a donor element such as phosphorous to a density of between E17 and E21 a/cm$^3$ to improve conductivity. The use of this gate element enables the elimination of an STI isolation element between the two contacts, which improves the lateral current conduction and Joule heating capability for an ESD event.

The P+ contact 18 is the anode of the SCR device, and is electrically connected to the N+ contact 116, the gate element 126, and the active device input or output pad 108.

The substrate 110 has N+ contact 120 and P+ contact 122, with a typical dopent concentration of between 1E19 and 1E21 a/cm$^3$ of donor and receptor dopents respectively. A gate element 132 overlays the surface between the STI 114B, the N+ contact 120, and the P+ contact 122. The P+ contact 122 is bounded by STI 14C. As depicted in FIG. 3B, gate elements 126 and 132 are constructed of an insulator, SiO$_2$ 126C/132C, a doped polysilicon conducting element 126B/132B, and a silicide 126A/132A. The presence of the gates 126 and 132 bounding the STI region 114B have the effect of reducing leakage current when connected to the appropriate voltage sources, that is typically to the anode voltage for gate element 126 and to the cathode voltage for gate element 132.

The N+ contact 120 is the SCR cathode and is electrically connected to the gate 132, the substrate P+ contact 122, and a second voltage source 124, typically ground. The presence of the gate 132 allows for the elimination of an STI isolation structure between the N+ contact 120 and the P+ contact 122, once again contributing to improved lateral current conduction and improved Joule heating characteristics for an ESD event. The connection of the gates 126 and 132 to the respective voltage sources also has the benefit of reducing device leakage during normal circuit operation.

Figure 4:
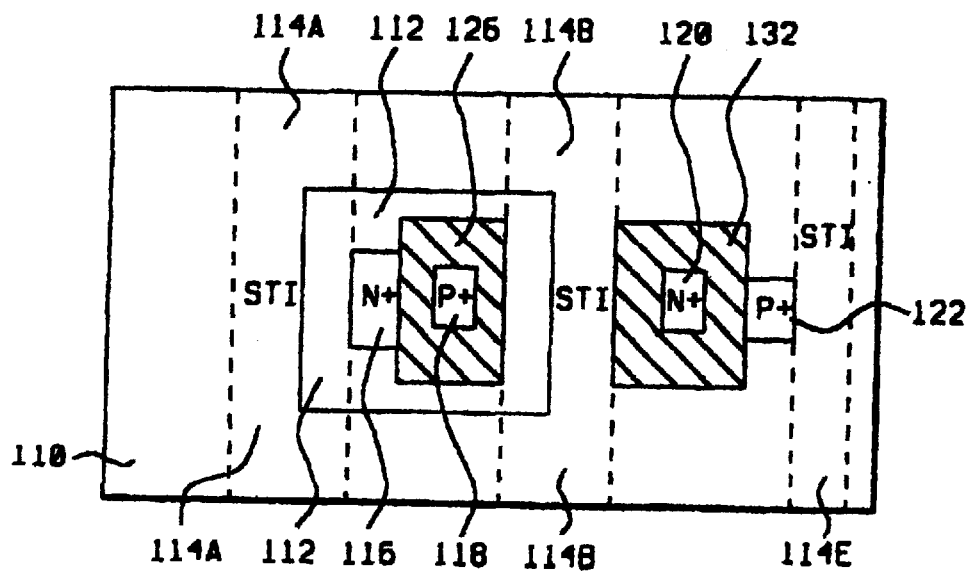
FIG. 4 is a top view of one embodiment of the invention for a SCR ESD protection device showing the horizontal topography of this embodiment.

As depicted in FIG. 4, the gate elements 126 and 132 have a rectangular horizontal topology that effectively bounds P+ contact region 118 and N+ contact region 120 respectively. The STI structures 114A and 114B are indicated by the dotted lines in FIG. 4.

Figure 5:
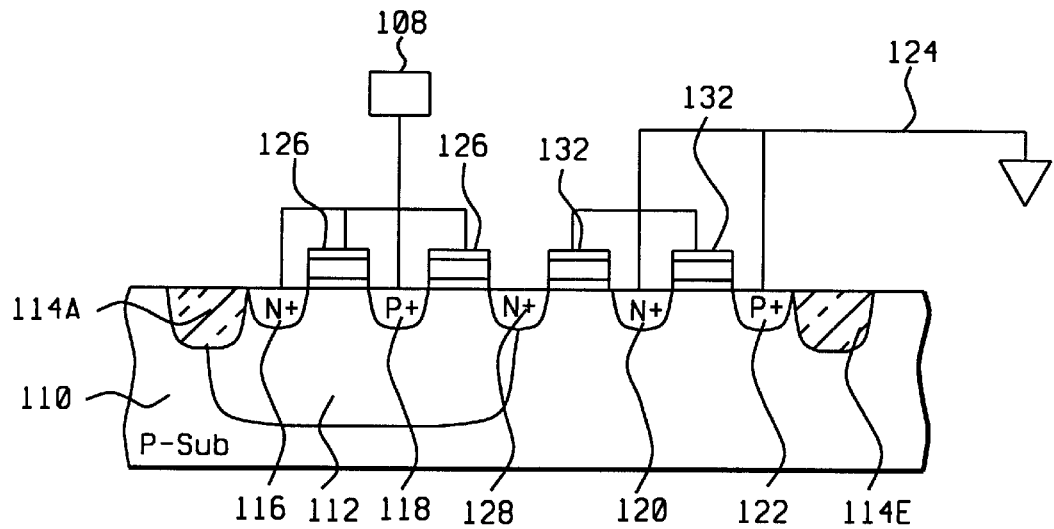
FIG. 5 is a simplified cross section of another embodiment of the invention for a LVTSCR.

Another embodiment of the invention is shown in FIG. 5. The unique design of the invention improves the ESD protection of a LVTSCR device. The SCR trigger voltage can be reduced by design by inserting a N+ doped region 128 on the lateral boundary between the N-well 112 and the substrate 110. This region has a dopent concentration typically between 1E19 and 1E21 a/cm$^3$ and forms the drain of a N-channel thin oxide field effect transistor (FET). The FET N+ drain 128 connects to the N region N-well 112 base of the SCR and the FET N+ source 120, which also serves as the SCR cathode, is connected to the second voltage source, tropically ground. This arrangement has the effect of lowering the trigger voltage of the SCR by the design of the channel length and/or the gate oxide thickness of the FET to provide a LVSCR element. The unique structure of the invention design places gate 126 between the N- well N+ contact 116 and the SCR P+ anode 118, and the P+ anode 118 and the FET drain 120. Again, this eliminates the need for any STI structures between these elements and at the same time limits leakage by connecting the gate to the SCR anode 118. Similarly, the invention structure places gate 132 between the FET source 120 and the substrate P+ contact 122. This gate 12 enables the elimination of STI element 14D, and serves to reduce the leakage current between N+ region 120 and P+ region 122

Figure 6:
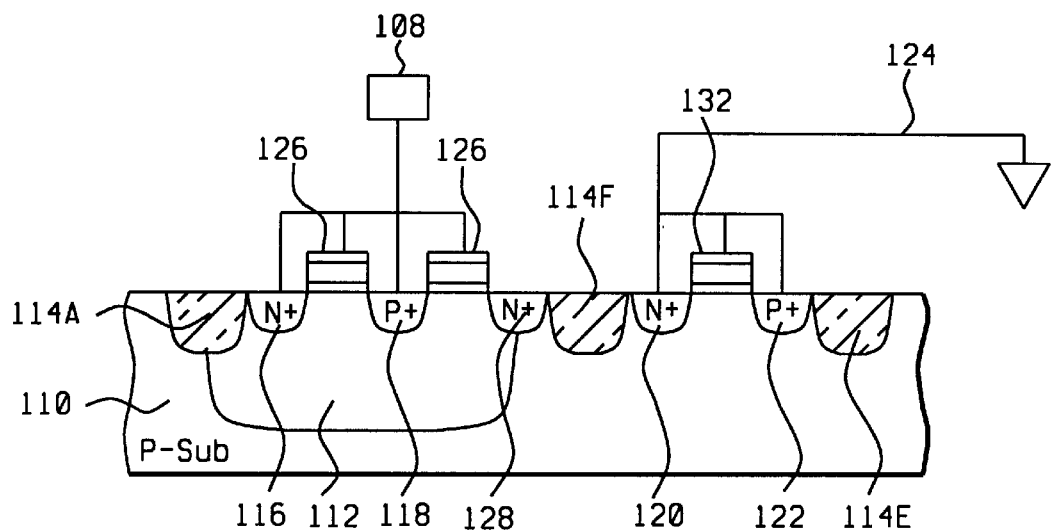
FIG. 6 is a simplified cross sectional representation of another embodiment of the invention for a modified lateral SCR ESD protection device.

In yet another embodiment depicted in FIG. 6, the invention is applied to the modified lateral SCR, resulting in improved ESD protection capabilities over the prior art design. In the method of the invention, a polysilicon gate 126 with $SiO_2$ insulator, poly conductor and silicide contact element, bridges the N-well N+ contact 116 and the N-well P+ contact 118, and also is between the P+ contact 118 and the N+ region 128. Another gate element 132 bridges the substrate N+ contact 120 and the substrate P+ contact 122. The N-well N+ contact 116, gate 126, and the N-well P+ contact 118, which also serves as the device anode, are electrically connected together and to the active circuit input pad 108.

The substrate N+ contact 120, which also serves as the SCR cathode, gate 132, and the substrate P+ contact 122 are electrically connected together and to a second voltage source 124, typically ground. A STI structure 114F provides isolation between the N+ contact region 128 and the cathode N+ region 120.

Figure 7A:
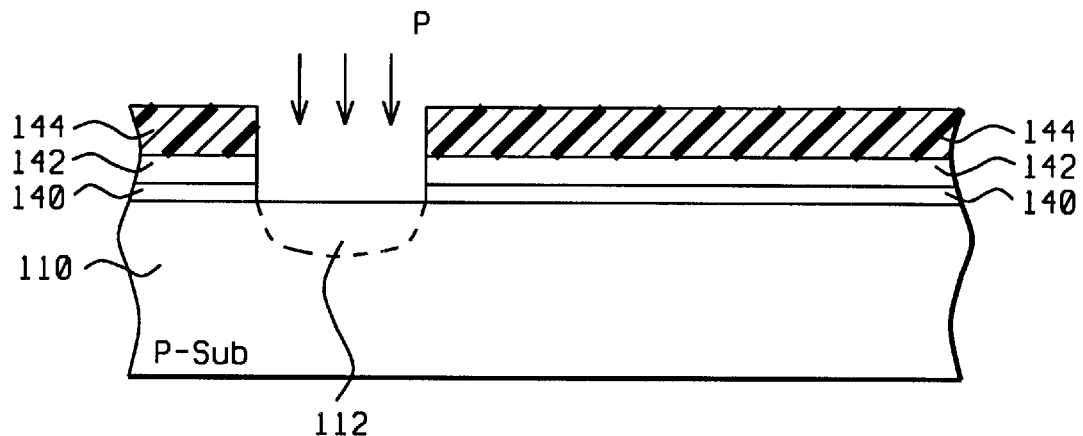
FIGS. 7A through 7F shows cross section representations of the invention for a SCR ESD protection device at various stages of the manufacturing process.

The process to develop an embodiment of the invention is outlined in FIG. 7A through FIG. 7F which shows the structure for a P substrate in various stages of processing. FIG. 7A represents a patterned semiconductor substrate 110 with a nominal P doping level of between about 1E14 and 1E16 a/cm$^3$. The substrate surface is covered by a thermally grown or chemical vapor deposition (CVD) first oxide layer 140, sometimes called the pad oxide, which provides thermal stress relief. This layer is typically between 200 and 600 Å in thickness. A CVD layer of silicon nitride (SiN) 142 derived typically from a silane or dichlorosilane source element is placed over the pad oxide as a masking element to a thickness of between 1000 and 2000 Å. This in turn is covered by a conventional photolithographic masking material such as photo resist (PR) 144 with a thickness typically between 4000 and 10,000 Å. The structure as shown in FIG. 7A has been patterned in preparation for the N-well 112 doping. A donor dopent, typically phosphorous (P), is implanted with a typical dosage range of between 1E15 and 1E17 cm$^2$) and with an energy range of between 30 and 80 KeV. This produces a N-well doping density of between 1E16 and 1E18 a/cm$^3$.

Figure 7B:
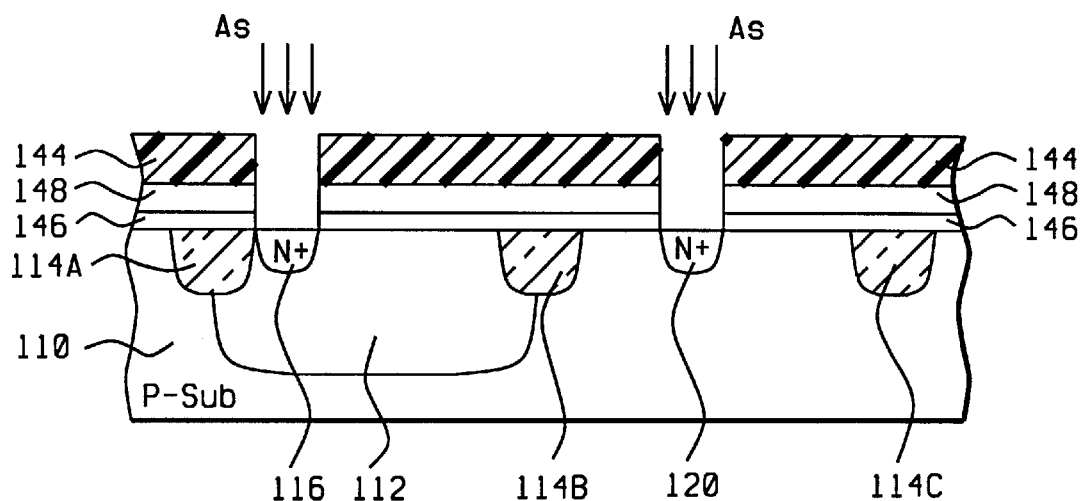

FIG. 7B represents the partially completed device after the N-well masking elements have been removed, shallow trench isolation (STI) elements have been inserted into the structure, and the substrate patterned in preparation for the doping of the N+ contracts regions, 116, 120. The STI elements are created with an etching process, typically a dry anisotropic plasma etch to form the trenches, typically to a depth of between 0.4 and 2.5 um in depth and between 0.2 and 1 um in width. The trenches are subsequently filled with a silicon oxide ($SiO_2$) by a low-pressure chemical vapor deposition (LPCVD), or a sub-atmospheric CVD (SACVD), or a high-density plasma process. After filling, the STI elements are planarized by either an etch process or, more typically, a chemical mechanical polish (CNIP) process. The SiN layer 142 is removed, typically using a hot phosphoric acid ($H_3PO_4$) with a temperature between about 150 and 180 degrees centigrade (° C.), and the pad oxide has been removed typically using dilute hydrofluoric acid (HF).

A gate oxide layer 146 is then thermally grown to a thickness of between about 50 and 180 Å, and a layer of polysilicon (poly) 148 has been deposited by LPCVD to a thickness of between 1500 and 3000 Å to serve as part of the gate conductor system. The LPCVD poly process uses a 100% silane source, or, alternatively, a gas stream containing $N_2$ or $H_2$. The poly is typically doped with a donor element such as As to produce a dopent concentration of between 1E17 and 1E21 a/cm$^3$ to improve conductivity. The N+ contact regions 116 and 120 are doped with a donor element as indicated in FIG. 7B, typically arsenic (As), with a dosage level between about 1E13 and 1E15 a/cm$^2$, and with an energy between 20 and 40 KeV. This results in N+ contact regions with a donor concentration of between about 1E19 and 1E21 a/cm$^3$.

Figure 7C:
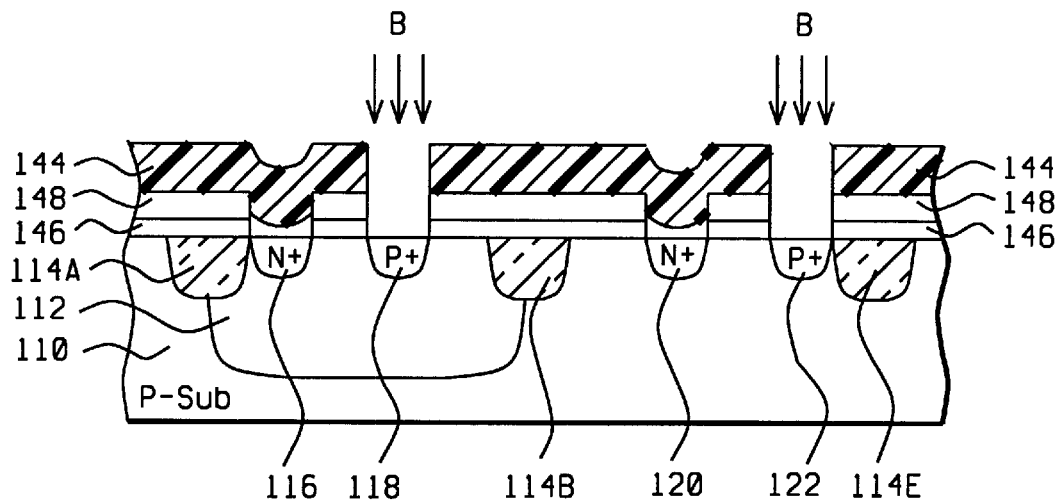
Figure 7D:
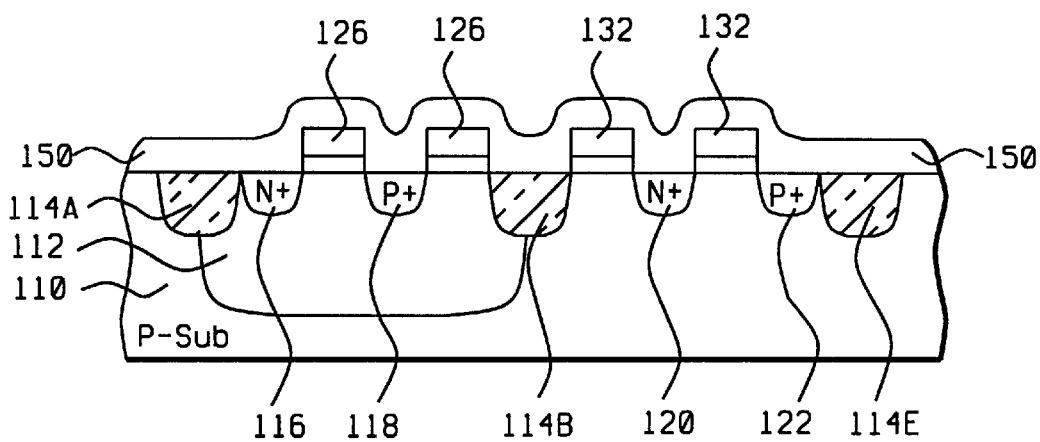
Figure 7E:
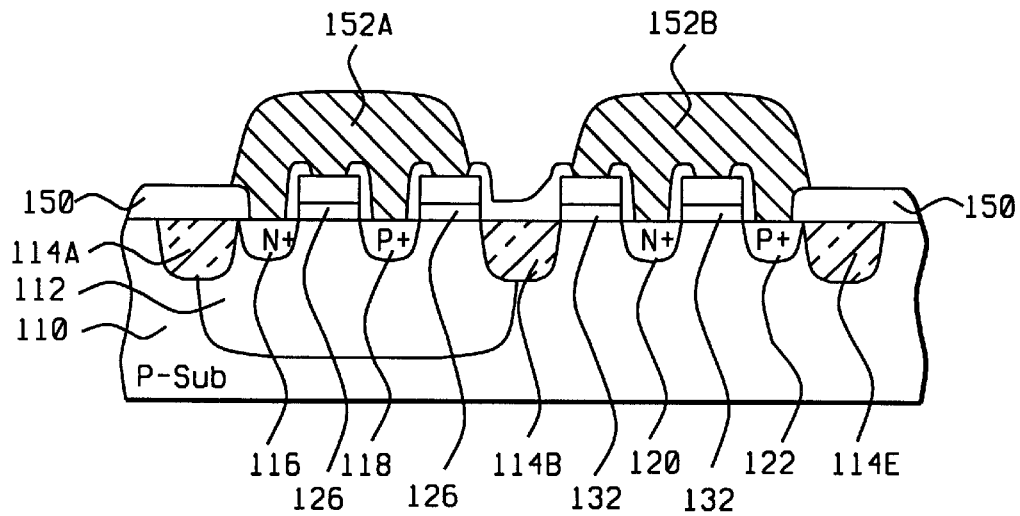

FIG. 7C shows the partially completed device patterned and prepared for the P+ contact region implant. This is done with an acceptor element, typically boron (B) with a dosage of between about 1E12 and 1E13 a/cm$^2$, and an implant energy of between 40 and 80 KeV resulting in a P+ contact area with a dopent concentration of between 1E19 and 1E21 a/Cm$^3$. The device is then patterned to remove the gate oxide and polysilicon from regions where not required, and an oxide layer 150, is deposited, typically by LPCVD as shown in FIG. 7D.

This oxide 150 is patterned in preparation for etching metal contact openings, typically using a RIE anisotropic etch process, to the N+ regions 116 and 120, and the P+ regions 118 and 122, and the contact regions of gates 126 and 132. This is followed by a blanket evaporation of metal typically using aluminum or 1% silicon doped aluminum, but could be other alloys such as titanium platinum. The main metallurgy system could also be used in conjunction with refractory type "barrier" metals such as titanium-tungsten (TiW) or titanium nitride (TiN). Most commonly used methods for developing the metallurgy system on the wafer are vacuum evaporation using either filaments, electron beam or flash hot plate as sources, or physical vapor deposition (PVD) commonly known as sputtering. Common sputtering methods would be RF sputtering or magnetron sputtering. With any method, the wafer is blanketed with the metal, then patterned and unwanted metal removed by etching resulting in a structure shown in FIG. 7E.

Figure 7F:
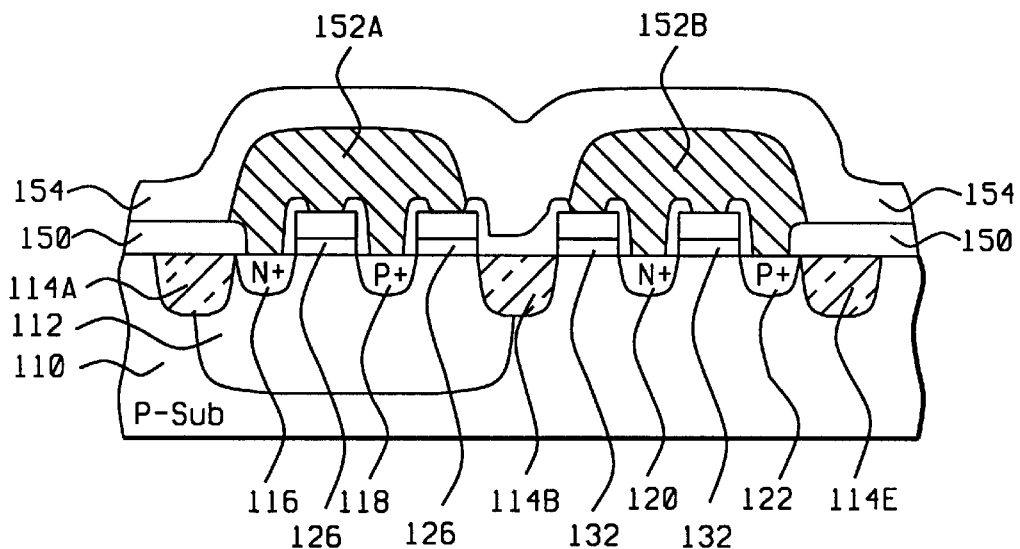

The metal element 152A electrically connects the SCR anode P4 region 118 with gate 126 and the N-well N+ contact 116. Not shown is the completion of the conductor to the logic circuit input pad. Similarly, as depicted in FIG. 7F, the metal element 152B electrically connects the SCR cathode N+ region 120 with the gate 132 and the substrate P+ contact 122. Not shown is the electrical connection of the conductor to a second voltage source, typically ground.

As represented in FIG. 7F, after selective removal of unwanted metal, a final passivation covering layer 154 is deposited, typically $SiO_2$, or silicon nitride (SiN), or borophosphorus silicate glass (BPSG).

While the invention has been particularly shown and described with reference to the preferred embodiments thereof, it will be understood by those skilled in the art that various changes in form and details may be made without departing from the spirit and scope of the invention.

What is claimed is:

1. A method of fabricating an improved silicon controlled rectifier electrostatic discharge protection device on a semiconductor substrate comprising:

forming a first doped region said semiconductor substrate;

forming a first and second isolation structure element at the lateral boundaries between said first doped region and said substrate;

forming a gate oxide insulation layer on said substrate surface;

forming a first conducting layer upon said gate oxide insulating layer;

forming a plurality of second doped regions within said substrate and within said first doped region;

forming a plurality of third doped regions within said substrate and within said first doped region;

forming a first gate structure on said substrate surface bridging between said second and said third doped regions within said first doped region and bridging between said third doped region within said first doped region and said second isolation structure by selectively removing areas of said gate oxide and said first conducting layer;

forming a second gate structure on said substrate surface bridging between said second and said third doped regions within said substrate outside of said first doped region and bridging between said second doped region within said substrate and said second isolation structure by selectively removing areas of said gate oxide and said first conducting layer;

forming a third isolation element structure between the lateral boundary of said third doped region outside of said first doped region on opposite side from said second gate structure;

forming a conduction system for said protection device;

connecting said second and said third doped regions adjacent to said first gate structure within said first doped region with said first gate structure and with a first voltage source;

connecting said second and said third doped regions adjacent to said second gate structure with said second gate structure and with a second voltage source;

forming a passivation layer for said protection device.

2. The method according to claim 1 whereby said first doped region is donor doped with phosphorous with a dosage between E15 and E17 $a/cm^2$ with an energy between 30 and 80 KeV to produce a N-well.

3. The method according to claim 1 whereby said first, second and third isolation elements are shallow trenches formed by anisotropic reactive ion etch and filled with SiO2 by a low pressure CVD and planarized by chemical mechanical polishing.

4. The method according to claim 1 whereby said first conducting layer is polysilicon appropriately doped to form the conductor element of said first and second gate structures.

5. The method according to claim 1 whereby said plurality of second doped regions are doped with a donor dopent such as arsenic to form N+ contact regions within said first doped region and within said substrate.

6. The method according to claim 1 whereby said plurality of third doped regions are doped with an acceptor dopent such as boron to form P+ contact regions within said first doped region and within said substrate.

7. The method according to claim 1 whereby said first gate structure surrounds said substrate surface region around said third doped region within said first doped region.

8. The method according to claim 1 whereby said second gate element surrounds said substrate surface region around said second doped region within the substrate lying outside of said first doped region.

9. The method according to claim 1 whereby said first voltage source is an active logic circuit input voltage source.

10. The method according to claim 1 whereby said second voltage source is ground.

11. The method according to claim 1 whereby said second doped region within said first doped region forms the anode of said SCR ESD protection device and said third doped region within said substrate outside of said first doped region forms the cathode of said SCR device.

* * * * *